US010444585B2

(12) United States Patent
Jian et al.

(10) Patent No.: US 10,444,585 B2
(45) Date of Patent: Oct. 15, 2019

(54) ARRAY SUBSTRATE, DISPLAY PANEL, AND DISPLAY DEVICE, INCLUDING THIN FILM TRANSISTOR HAVING INCREASED EFFECTIVE LENGTH OF CHANNEL REGION

(71) Applicants: Shanghai AVIC OPTO Electronics Co., Ltd., Shanghai (CN); Tianma Micro-Electronics Co., Ltd., Shenzhen (CN)

(72) Inventors: Shoufu Jian, Shanghai (CN); Lina Sun, Shanghai (CN); Yiming Wang, Shanghai (CN)

(73) Assignees: SHANGHAI AVIC OPTO ELECTRONICS CO., LTD., Shanghai (CN); TIANMA MICRO-ELECTRONICS CO., LTD., Shenzhen (CN)

( * ) Notice: Subject to any disclaimer, the term of this patent is extended or adjusted under 35 U.S.C. 154(b) by 85 days.

(21) Appl. No.: 15/404,524

(22) Filed: Jan. 12, 2017

(65) Prior Publication Data
US 2017/0125442 A1 May 4, 2017

(30) Foreign Application Priority Data

Sep. 27, 2016 (CN) .......................... 2016 1 0855822

(51) Int. Cl.
*H01L 27/14* (2006.01)
*G02F 1/1368* (2006.01)
(Continued)

(52) U.S. Cl.
CPC ........ *G02F 1/1368* (2013.01); *H01L 27/1222* (2013.01); *H01L 29/78696* (2013.01);
(Continued)

(58) Field of Classification Search
CPC ............... H01L 27/124; H01L 27/1248; H01L 27/1222; H01L 29/41733; H01L 29/78696; G02F 1/1368
See application file for complete search history.

(56) References Cited

U.S. PATENT DOCUMENTS

2009/0173942 A1  7/2009 Hsiao et al.
2012/0320004 A1  12/2012 Kitakado
(Continued)

FOREIGN PATENT DOCUMENTS

CN   102130156 A   1/2011
CN   103034000 A   4/2013
CN   104143560 A   11/2014

*Primary Examiner* — Matthew E. Gordon
(74) *Attorney, Agent, or Firm* — Anova Law Group, PLLC

(57) ABSTRACT

An array substrate, a display panel, and a display device are provided. The array substrate includes a substrate, and a plurality of scanning lines and a plurality of data lines disposed on the substrate. The plurality of scanning lines and the plurality of data lines are insulated and intersected to define a plurality of pixel units. Each pixel unit includes a thin film transistor and a pixel electrode. A gate electrode of the thin film transistor is electrically connected to a scanning line, a source electrode of the thin film transistor is electrically connected to a data line, and a drain electrode of the thin film transistor is electrically connected to the pixel electrode. An effective length of a channel region of the thin film transistor is longer than or equal to one third of a length of the pixel unit along an extension direction of the scanning line.

19 Claims, 9 Drawing Sheets

(51) Int. Cl.
*H01L 29/786* (2006.01)
*H01L 27/12* (2006.01)
*H01L 27/32* (2006.01)

(52) U.S. Cl.
CPC ............... *G02F 2001/13685* (2013.01); *H01L 27/3262* (2013.01); *H01L 29/78633* (2013.01); *H01L 29/78675* (2013.01)

(56) References Cited

U.S. PATENT DOCUMENTS

| | | |
|---|---|---|
| 2014/0313445 A1 | 10/2014 | Kimura |
| 2014/0319526 A1 | 10/2014 | Choi |
| 2014/0319527 A1 | 10/2014 | Shin et al. |
| 2015/0187796 A1* | 7/2015 | Zhao ................... H01L 27/124 257/72 |
| 2016/0189611 A1* | 6/2016 | Jinta ................... H01L 51/504 345/690 |
| 2016/0363796 A1* | 12/2016 | Tanaka ............. H01L 29/41733 |
| 2017/0278917 A1* | 9/2017 | Kim ................... H01L 27/3276 |
| 2017/0317110 A1* | 11/2017 | Lee ................... H01L 29/78642 |

* cited by examiner

ARRAY SUBSTRATE, DISPLAY PANEL, AND DISPLAY DEVICE, INCLUDING THIN FILM TRANSISTOR HAVING INCREASED EFFECTIVE LENGTH OF CHANNEL REGION

CROSS-REFERENCES TO RELATED APPLICATIONS

This application claims priority of Chinese Patent Application No. 201610855822.7, filed on Sep. 27, 2016, the entire contents of which are hereby incorporated by reference.

FIELD OF THE INVENTION

The present disclosure generally relates to the field of display technology and, more particularly, relates to an array substrate, a display panel and a display device.

BACKGROUND

With the development of display technologies, the display effect of liquid crystal display products is enhanced continuously and, thus, the application field of the liquid crystal display products is widely broadened.

The power consumption of the display products is proportional to the display driving frequency. Therefore, to reduce the power consumption of the display products, the display driving frequency needs to be reduced. However, in current display products, after the driving frequency is reduced, in a holding stage, the pixel electrode voltage may keep decreasing due to the existence of the leakage current, and the display image flicker may easily occur, thus affecting the display effect.

The disclosed array substrate, display panel, and display device are directed to solving at least partial problems set forth above and other problems.

BRIEF SUMMARY OF THE DISCLOSURE

One aspect of the present disclosure provides an array substrate. The array substrate includes a substrate, and a plurality of scanning lines and a plurality of data lines disposed on the substrate. The plurality of scanning lines and the plurality of data lines are insulated and intersected to define a plurality of pixel units. Each pixel unit includes a thin film transistor and a pixel electrode. A gate electrode of the thin film transistor is electrically connected to a scanning line, a source electrode of the thin film transistor is electrically connected to a data line, and a drain electrode of the thin film transistor is electrically connected to the pixel electrode. An effective length of a channel region of the thin film transistor is longer than or equal to one third of a length of the pixel unit along an extension direction of the scanning line.

Another aspect of the present disclosure provides a display panel including an array substrate. The array substrate includes a substrate, and a plurality of scanning lines and a plurality of data lines disposed on the substrate. The plurality of scanning lines and the plurality of data lines are insulated and intersected to define a plurality of pixel units. Each pixel unit includes a thin film transistor and a pixel electrode. A gate electrode of the thin film transistor is electrically connected to a scanning, line, a source electrode of the thin film transistor is electrically connected to a data line, and a drain electrode of the thin film transistor is electrically connected to the pixel electrode. An effective length of a channel region of the thin film transistor is longer than or equal to one third of a length of the pixel unit along an extension direction of the scanning line.

Other aspects of the present disclosure can be understood by those skilled in the art in light of the description, the claims, and the drawings of the present disclosure.

BRIEF DESCRIPTION OF THE DRAWINGS

To make more clearly the explanation of technical solutions in embodiments of the present disclosure or current techniques, drawings needed in the embodiments or current techniques are briefly illustrated below. Apparently, the drawings described below only correspond to some embodiments of the present disclosure, and it is possible for those ordinarily skilled in the art to derive other drawings from the accompanying drawings without creative effort.

DETAILED DESCRIPTION

The present disclosure will now be described in more detail hereinafter with reference to exemplary embodiments thereof as shown in the accompanying drawings. It should be understood that the exemplary embodiments disclosed herein are for illustrative purpose only, and are not intended to limit the present disclosure. In addition, it should be noted that, for ease of description, the accompanying drawings merely illustrate a part but not all structures related to the present disclosure.

As discussed above, in existing display products, after the driving frequency is reduced, in a holding stage, the pixel electrode voltage may keep decreasing due to the existence of the leakage current, and the display image flicker may easily occur, thus affecting the display effect.

Directed to solving at least partial problems set forth above and other problems, the present disclosure provides an improved array substrate, a display panel, and a display device. According to the present disclosure, the effective length of the channel region of the thin film transistor on the array substrate is configured to be longer than or equal to one third of the length of the pixel unit along the extension direction of the scanning line, thus increasing the resistance of the thin film transistor. Because the voltage between the two ends of the thin film transistor is fixed, the leakage current of the thin film transistor may be reduced, and the variance of the pixel electrode voltage may be decreased. Accordingly, the flicker of the display image caused by a large reduction in the pixel electrode voltage may be avoided, thus enhancing the display effect of the display panel when being driven at a low frequency.

Figure 1:
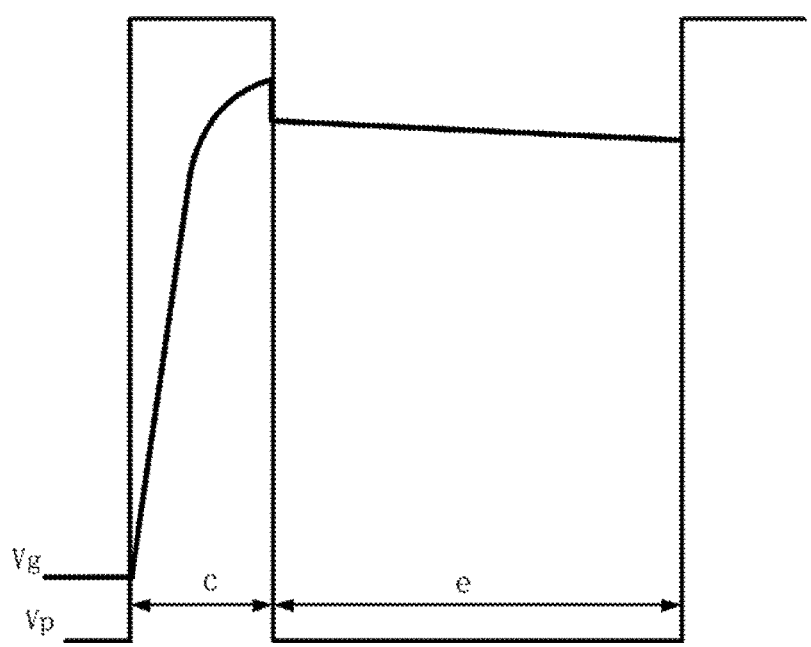
FIG. 1 illustrates pixel electrode voltage variation in an exemplary frame consistent with disclosed embodiments.

FIG. 1 illustrates pixel electrode voltage variation in an exemplary frame consistent with disclosed embodiments. As shown in FIG. 1, Vg represents a gate electrode driving signal supplied to scanning lines, and Vp represents a pixel electrode voltage. During display, the display panel may divide each frame into a charging stage c and a holding stage e. in the charging stage c, the gate electrode driving signal Vg may be a high voltage level, and a thin film transistor connected to the pixel electrode may be switched on to charge the pixel electrode.

Thus, the pixel electrode voltage Vp may become a corresponding grey-scale voltage. That is, the writing of the information to be displayed by the whole image may be completed. In the holding stage e, the gate electrode lines may be multiplexed as the scanning lines and supply a certain direct current signal or supplies no signal, and the thin film transistor may be switched off till the next frame signal begins.

Due to the influence of the leakage current, in the holding stage e, electric charges of the pixel electrode may be leaked through the thin film transistor, and the pixel electrode voltage Vp may keep decreasing with the time. If the driving frequency of the display panel is reduced, then the duration of the holding stage e may increase, and the reduction in the pixel electrode voltage Vp may be relatively large. Accordingly, in the holding stage, the pixel electrode voltage Nip may fail to satisfy the requirements of image display, and the image flicker may easily occur, thus affecting the display effect.

Figure 2:
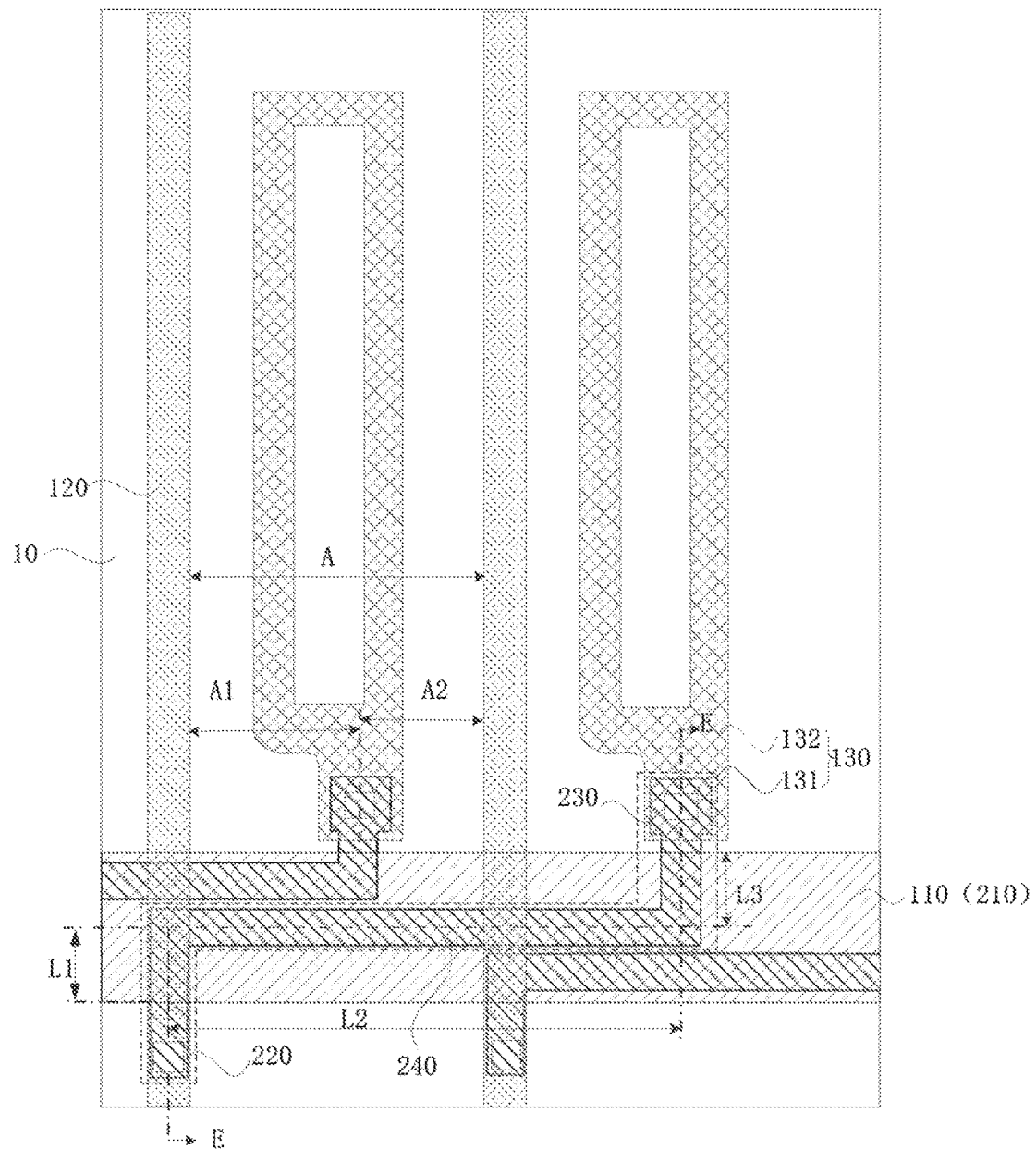
FIG. 2 illustrates an exemplary array substrate consistent with disclosed embodiments.
Figure 3:
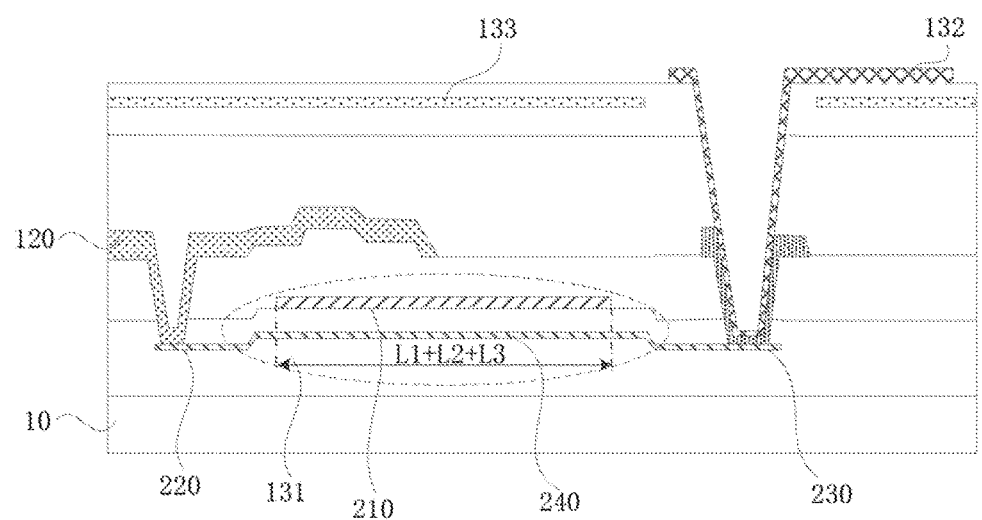
FIG. 3 illustrates an E-E cross-sectional view of an exemplary array substrate in FIG. 2 consistent with disclosed embodiments.

FIG. 2 illustrates an exemplary array substrate consistent with disclosed embodiments. FIG. 3 illustrates an E-E cross-sectional view of an exemplary array substrate in FIG. 2 consistent with disclosed embodiments. Referring to FIG. 2 and FIG. 3, the array substrate may include a substrate 10, a plurality of scanning lines 110 disposed on the substrate 10. and a plurality of data lines 120 disposed on the substrate 10. The plurality of scanning lines 110 and the plurality of data lines 120 may be insulated and intersected to define a plurality of pixel units 130.

Referring to FIG. 2, a pixel unit 130 may include a thin film transistor 131 and a pixel electrode 132. The thin film transistor 131 may include a gate electrode 210, a source electrode 220, a drain electrode 230, and an active layer 240. The gate electrode 210 may be electrically connected to the scanning line 110, the source electrode 220 may be electrically connected to the data line 120, and the drain electrode 230 may be electrically connected to the pixel electrode 132 of the pixel unit 130. An effective length (L1+L2+L3) of the channel region of the thin film transistor 131 may be longer than or equal to one third of a length A of the pixel unit 130 along an extension direction of the scanning line 110.

Further, the gate electrode 210 of the thin film transistor 131 and the scanning line 110 may be fabricated using the same process. The gate electrode 210 may be a part of the scanning line 110. As shown in FIG. 2, the gate electrode 210 and the scanning line 110 are not differentiated. The channel region of the thin film transistor 131 may be an overlapping region between the active layer 240 of the thin film transistor 131 and the scanning line 110 (or the gate electrode 210). The effective length of the channel region may be the length of the overlapping region between the active layer 240 of the thin film transistor 111 and the scanning line 110 (or the gate electrode 210). Referring to FIG. 3, the pixel unit 130 may further include a common electrode 133 (not shown in FIG. 2).

Specifically, the effective length of the channel region of the thin film transistor 131 may be proportional to the resistance of the thin film transistor 131. That is, when the effective length of the channel region of the thin film transistor 131 increases, the resistance of the thin film transistor 131 may increase correspondingly. In one embodiment, the effective length of the channel region of the thin film transistor 131 may be configured to be longer than or equal to one third of the length A of the pixel unit 130 along the extension direction of the scanning line 110, thus increasing the resistance of the thin film transistor 131. Because the voltage between two ends of the thin film transistor 131 is fixed, the leakage current of the thin film transistor 131 may be reduced, and the variance of the pixel electrode voltage may be decreased. Accordingly, the flicker of the display image caused by a large reduction in the pixel electrode voltage may be avoided, thus enhancing the display effect of the display panel when being driven at a low frequency.

Optionally, referring to FIG. 2, at least one data line 120 may be disposed between the data line 120 electrically connected to the source electrode 220 of the thin film transistor 131 and the drain electrode 230 of the thin film transistor. Thus, the distance between the drain electrode 230 and the source electrode 220 of the thin film transistor 131 along the scanning line 110 may be increased. Correspondingly, the length of the region of the active layer 240 of the thin film transistor 131 corresponding to the scanning line 110 or the gate electrode 210 may be increased. That is, the effective length of the channel region may be increased, resulting in an increased resistance of the thin film transistor 131. Accordingly, the leakage current of the thin film transistor 131 may be reduced, and the display effect of the display panel when being driven at a low frequency may be enhanced.

FIG. 2 merely illustrates a situation where one data line 120 is disposed between the data line 120 electrically connected to the source electrode 220 of the thin film transistor 131 and the drain electrode 230 of the thin film transistor 131. However, the present disclosure is not intended to limit the number of the data lines 120 disposed between the data line 120 electrically connected to the source electrode 220 of the thin film transistor 131 and the drain electrode 230 of the thin film transistor 131.

Optionally, referring to FIG. 2, among the two data lines 120 disposed adjacent to the drain electrode 230 of the thin film transistor 131, the data line 120 with a shorter distance to the source electrode 220 of the thin film transistor 131 may be a first data line, and the data line 120 with a longer distance to the source electrode 220 of the thin film transistor 131 may be a second data line. The distance A1 from the drain electrode 230 of the this film transistor 131 to the first data line may be longer than the distance A2 from the drain electrode 230 of the thin film transistor 131 to the second data line. Thus, the distance between the drain electrode 230 and the source electrode 220 of the thin film transistor 131 along the scanning line 110 may be further increased.

That is, the length of the region of the active layer 240 of the thin film transistor 131 corresponding to the scanning line 110 or the gate electrode 210 may be further increased. Thus, the effective length of the channel region may be increased, resulting in an increased resistance of the thin film transistor 131. Accordingly, the leakage current of the thin film transistor 131 may be reduced, and the display effect of the display panel being driven at a low frequency may be enhanced.

Figure 4:
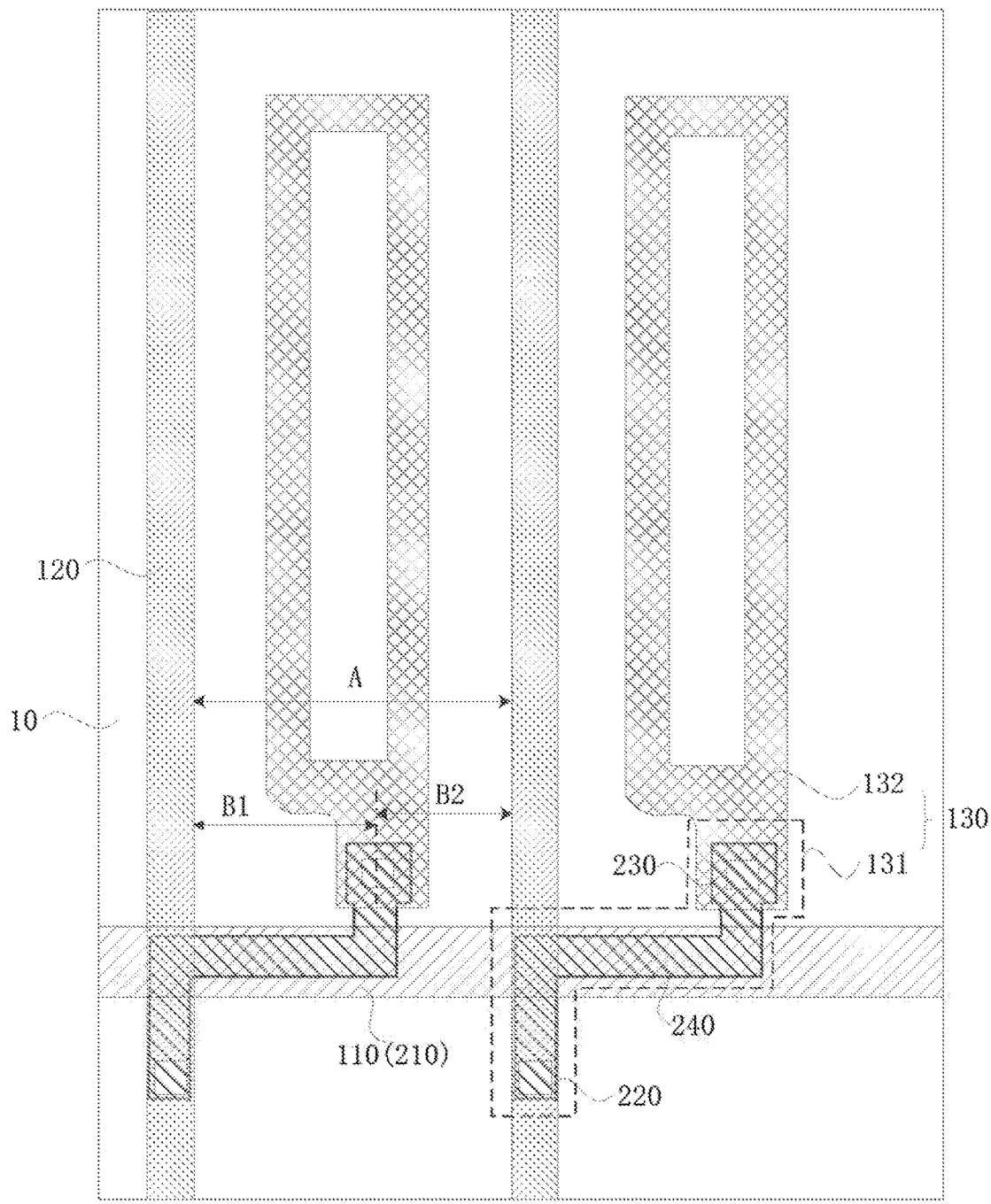
FIG. 4 illustrates another exemplary array substrate consistent with disclosed embodiments.

FIG. 4 illustrates another exemplary array substrate consistent with disclosed embodiments, Referring to FIG. 4, the source electrode 220 of the thin film transistor 131 may also be electrically connected to one of the data lines 120 adjacent to the drain electrode 230 of the thin film transistor 131. Thus, the thin film transistor 131 may no longer need to run across two or more pixel units 130, and the scanning line 110 may be fabricated to be narrower. Accordingly, the effective length of the channel region of the thin film transistor 131 may be increased, and a relatively high aperture ratio of the pixel unit 130 may simultaneously be ensured, Optionally, referring to FIG. 4, the distance B1 from the drain electrode 230 of the thin film transistor 131 to the data line 120 electrically connected to the source electrode 220 of the thin film transistor 131 may be longer than the distance B2 from the drain electrode 230 of the thin film transistor 131 to another data line 120 adjacent to the drain electrode 230 of the thin film transistor 131. The distance B1 may be configured to be longer than the distance B2 and, thus, the length of the channel region of the thin film transistor 131 may be longer than a half of the length A of the pixel unit 130 along the extension direction of the scanning line 110. Thus, the thin film transistor 131 may have a relatively high resistance, the leakage current of the thin film transistor 131 may be reduced, and the variance of the pixel electrode voltage may be decreased. Accordingly, the flicker of the display image caused by a large reduction in the pixel electrode voltage may be avoided, thus enhancing the display effect of the display panel when being driven at a low frequency.

In the above-described embodiments, the dimension of the channel region along the scanning line 110 may be increased by increasing the distance between the drain electrode 230 and the source electrode 220 of the thin film transistor 131 along the scanning line 110. Thus, the effective length of the channel region may be increased. However, the present disclosure is not intended to limit the methods that increase the effective length of the channel region. In other embodiments, other methods may be used to increase the effective length of the channel region.

Optionally, the effective length of the channel region of the thin film transistor 131 may be longer than the distance between the source electrode 220 and the drain electrode 230 of the thin film transistor 131 along the extension direction of the scanning line 110.

Figure 5:
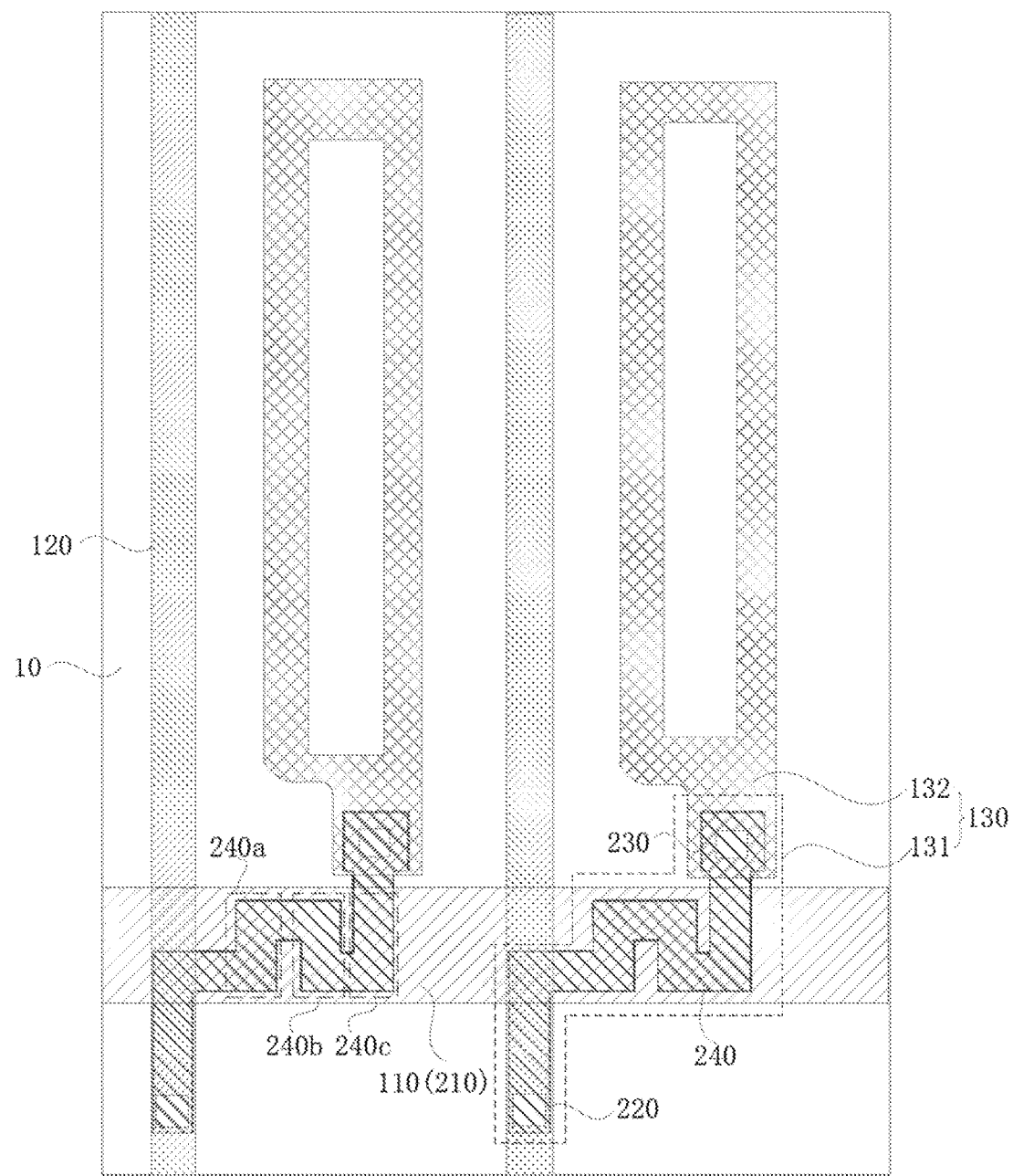
FIG. 5 illustrates another exemplary array substrate consistent with disclosed embodiments.

FIG. 5 illustrates another exemplary array substrate consistent with disclosed embodiments. Referring to FIG. 5, a projection of the channel region of the thin film transistor 131 on the substrate 10 may have a plurality of buckling portions. Specifically, referring to FIG. 5, a plurality of n-shaped or u-shaped buckling portions may be configured to increase the dimension of the channel region of the thin film transistor 131 along an extension direction of the data line 120. Accordingly, the effective length of the channel region may be increased.

It should be noted that FIG. 5 merely illustrates a situation where the channel region includes one n-shaped and one u-shaped buckling portion, and the channel region may have three sub-channel regions 240a, 240b, and 240c arranged in parallel along the extension direction of the data line 120. However, the present disclosure is not intended to limit the number of the buckling portions. In other embodiments, the channel region may have a plurality of buckling portions and, thus, the channel region may have a plurality of sub-channel regions arranged in parallel along the extension direction of the data line 120.

Figure 6:
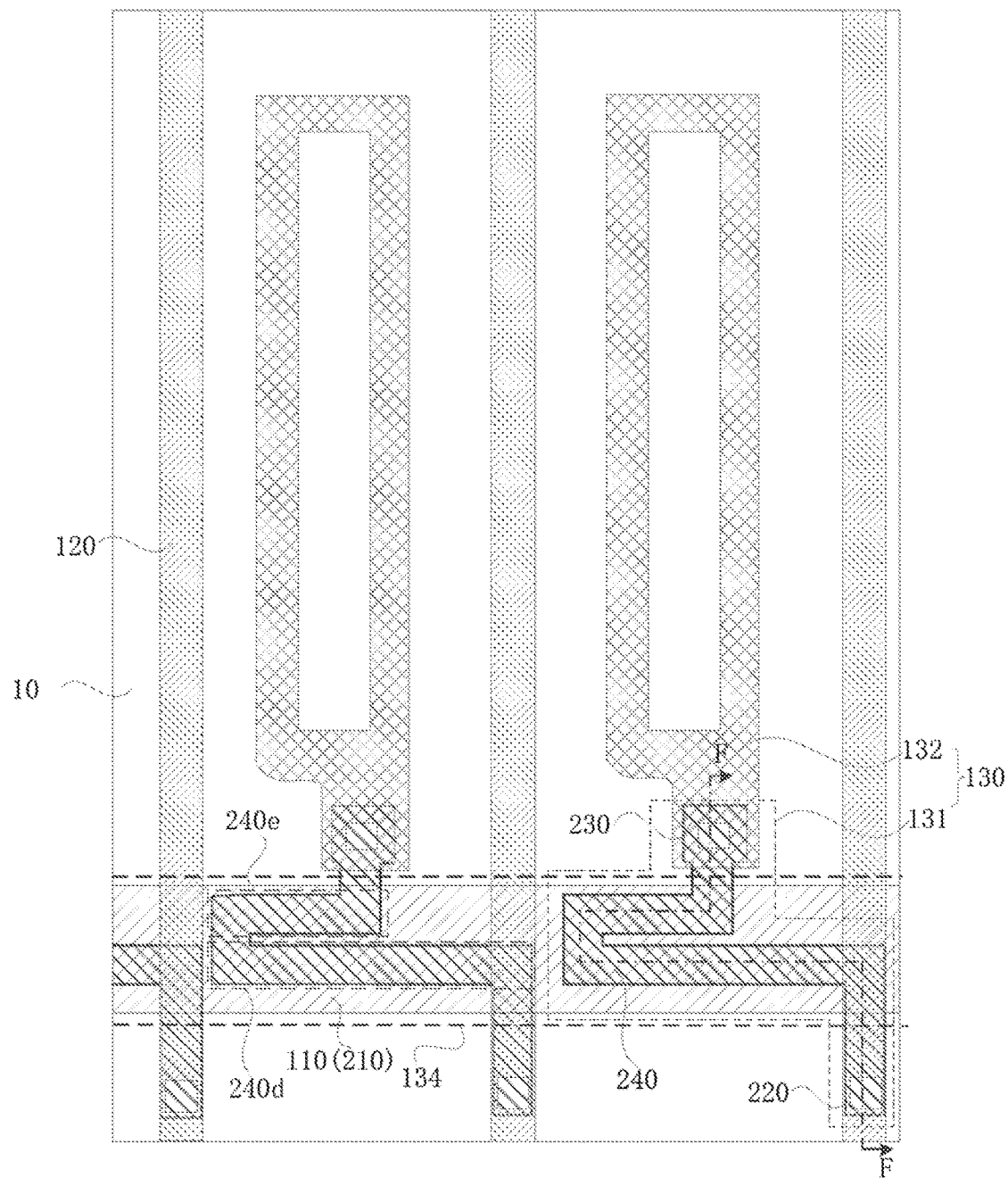
FIG. 6 illustrates another exemplary array substrate consistent with disclosed embodiments.

FIG. 6 illustrates another exemplary array substrate consistent with disclosed embodiments. Referring to FIG. 6, a plurality C-shaped buckling portions may be configured in the channel region of the thin film transistor 131 and, thus, the dimension of the channel region of the thin film transistor 131 along the extension direction of the scanning line 110 may be increased. Specifically, the dimension of the channel region of the thin film transistor 131 along the extension direction of the scanning line 110 may be substantially greater than the distance between the source electrode 220 and the drain electrode 230 of the thin film transistor 131 along the extension direction of the scanning line 110. Accordingly, the resistance of the thin film transistor 131 may be increased, and the leakage current may be reduced.

FIG. 6 merely illustrates a situation where the channel region includes one C-shaped buckling portion, and the channel region may have two sub-channel regions 240d and 240e arranged in parallel along the extension direction of the scanning line 120. However, the present disclosure is not intended to limit the number of the buckling portions. In other embodiments, the channel region may have a plurality of buckling portions and, thus, the channel region may have a plurality of sub-channel regions arranged in parallel along the extension direction of the scanning line 110

Specifically, FIG. 5 and FIG. 6 illustrates three types of the shape of the buckling portions. The present disclosure is not intended to limit the shape of the buckling portions. In other embodiments, the buckling portions may be in other shapes, or in shapes combining a plurality of different shapes. Further, as shown in FIG. 5 and FIG. 6, a plurality of buckling portions may be configured in the channel region of the thin film transistor 131. Accordingly, the effective length of the channel region of the thin film transistor 131 may be longer than the distance between the source electrode 220 and the drain electrode 230 of the thin film transistor 131 along the extension direction of the scanning line 110. Thus, the thin film transistor 131 may no longer need to run across two or more pixel units 130, and the scanning line 110 may be fabricated to be narrower. Accordingly, the effective length of the channel region of the thin film transistor 131 may be increased, and a relatively high aperture ratio of the pixel unit 130 may simultaneously be ensured.

Further, in some embodiments, at least one scanning line may be disposed between the source electrode 220 and the drain electrode 230 of the thin film transistor 131 along the extension direction of the data line 120. Thus, the active layer 240 of the thin film transistor 131 may have a greater region overlapping the scanning line 110 or the gate electrode 210. That is, the effective length of the channel region may be increased, and the leakage current may be reduced. However, the present disclosure is not limited thereto. In some other embodiments, whether or not the source electrode 220 and the drain electrode 230 are spaced apart by the scanning line 110 along the extension direction of the data line 120 may depend on specific situations, as long as the effective length of the thin film transistor 131 is configured to be longer.

Optionally, the thin film transistor 131 may be a low-temperature poly-silicon (LTPS) thin film transistor. Specifically, the low-temperature poly-silicon thin film transistor may have a relatively high electron transfer rate, thus the response rate of the thin film transistor 131 may be relatively fast, and the charge and discharge rate of the pixel unit 130 may not be affected after the length of the channel region of the thin film transistor 131 is increased. Further, by using the low-temperature poly-silicon thin film transistor, the region occupied by the thin film transistor 131 may be smaller and thinner. Accordingly, not only the power consumption of the display panel may be reduced, but also a relatively high aperture ratio of the pixel unit may be ensured.

Figure 7:
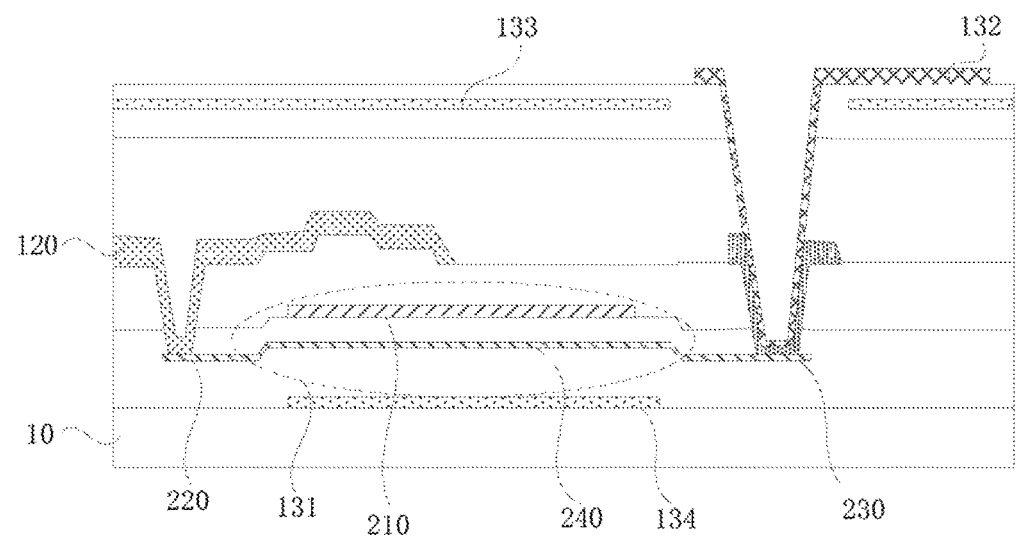
FIG. 7 illustrates an F-F cross-sectional view of an exemplary array substrate in FIG. 6 consistent with disclosed embodiments.

FIG. 7 illustrates an F-F cross-sectional view of an exemplary array substrate in FIG. 6 consistent with disclosed embodiments. Referring to FIG. 6 and FIG. 7, optionally, the thin film transistor 131 may be a top gate electrode, and the channel region of the thin film transistor 131 may be disposed on one side of the gate electrode 210 facing towards the substrate 10. Thus, the gate electrode 210 may shield the channel region of the thin film transistor 131. Accordingly, when light emits from one side of the active layer 240 facing towards pixel electrode 132, an increase in the leakage current caused by photon-generated carriers induced by light irradiating the channel region may be avoided.

Further, the pixel unit 130 may also include a light-shielding layer 134, and the light-shielding layer 134 may be disposed on one side of the channel region of the thin film transistor 131 facing towards the substrate 10. The vertical projection of the light-shielding layer 134 on the substrate 10 may cover the vertical projection of the channel region of the thin film transistor 131 on the substrate 10. Specifically, by configuring the light-shielding layer 134 to shield the channel region of the thin film transistor 131, when light emits from one side of the active layer 240 facing towards the substrate 10, an increase in the leakage current caused by photon-generated carriers induced by light irritating the channel region may be avoided. Thus, the properties of the thin film transistor 131 may be improved, the variance of the pixel electrode voltage may be decreased, and the low-frequency driving display effect may be enhanced.

The above-described embodiments merely illustrate the present disclosure using an array substrate in a liquid crystal display panel as an example. However, the present disclosure is not limited thereto, in some other embodiments, the array substrate may be applied in a self light emitting display panel such as an organic light emitting display panel.

Figure 8:
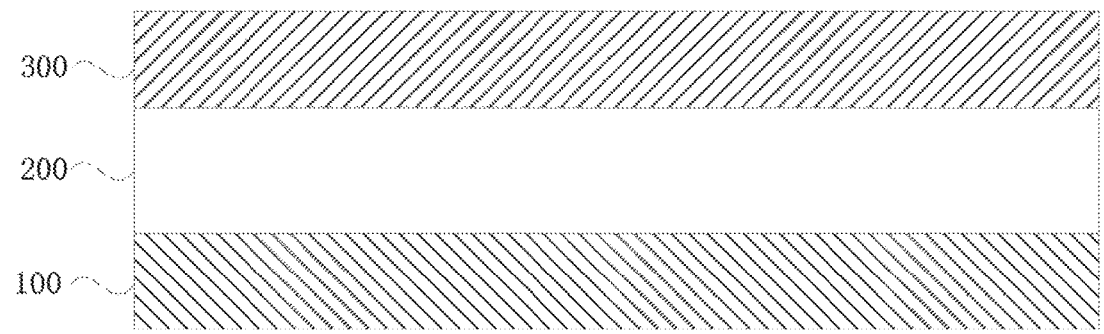
FIG. 8 illustrates an exemplary display panel consistent with disclosed embodiments.

The present disclosure also provides a display panel. FIG. 8 illustrates an exemplary display panel consistent with disclosed embodiments. As shown in FIG. 8, the disclosed display panel may include an array substrate 100 described in any above-described embodiment of the present disclosure. Optionally, the display panel may also include a color film substrate 300 arranged opposite to the array substrate 100, and a liquid crystal layer 200 sandwiched between the array substrate 100 and the color film substrate 300.

Figure 9:
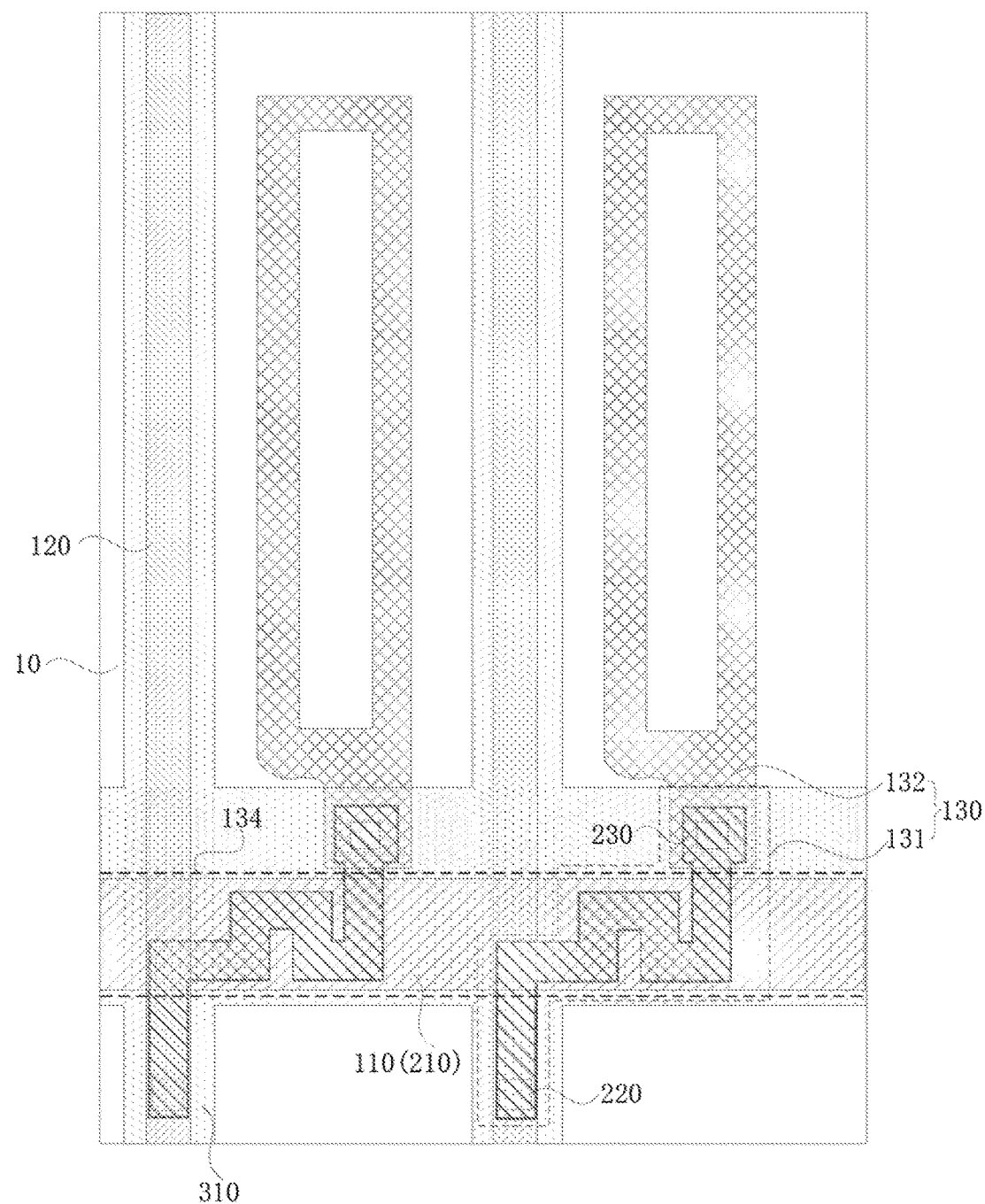
FIG. 9 illustrates a perspective view of an exemplary display panel consistent with disclosed embodiments.

FIG. 9 illustrates a perspective view of an exemplary display panel consistent with disclosed embodiments, As shown in FIG. 9, a black matrix (i.e., a light shielding matrix) 310 may be disposed on the color film substrate 300, and a vertical projection of the thin film transistor 131 on the color film substrate 300 may be inside the black matrix 301.

Optionally, the image refresh frequency of the display panel may be within a range of approximately 0.5 Hz-45 Hz. When the image refresh frequency is higher than 45 Hz, the power consumption of the display panel may be relatively high, resulting in the depletion of resources and energies. However, the disclosed display panel with a structure designed according to any above-described embodiment may effectively reduce the image refresh frequency, and simultaneously maintain stable display images when the display panel operates at a relatively low frequency. Accordingly, a relatively high image display quality may be ensured, and simultaneously the power consumption of the display panel may be reduced.

In the disclosed display panel, the effective length of the channel region of the thin film transistor on the array substrate may be configured to be longer than or equal to one third of the length of the pixel unit along the extension direction of the scanning line, thus increasing the resistance of the thin film transistor. Further, because the voltage between two ends of the thin film transistor is fixed, the leakage current of the thin film transistor may be reduced, and the variance of the pixel electrode voltage may be decreased. Accordingly, the flicker of the display image caused by a large reduction in the pixel electrode voltage may be avoided, thus enhancing the display effect of the display panel when being driven at a low frequency, Further, the display panel may use a lower image refresh frequency, and the power consumption of the display panel may be reduced.

Figure 10:
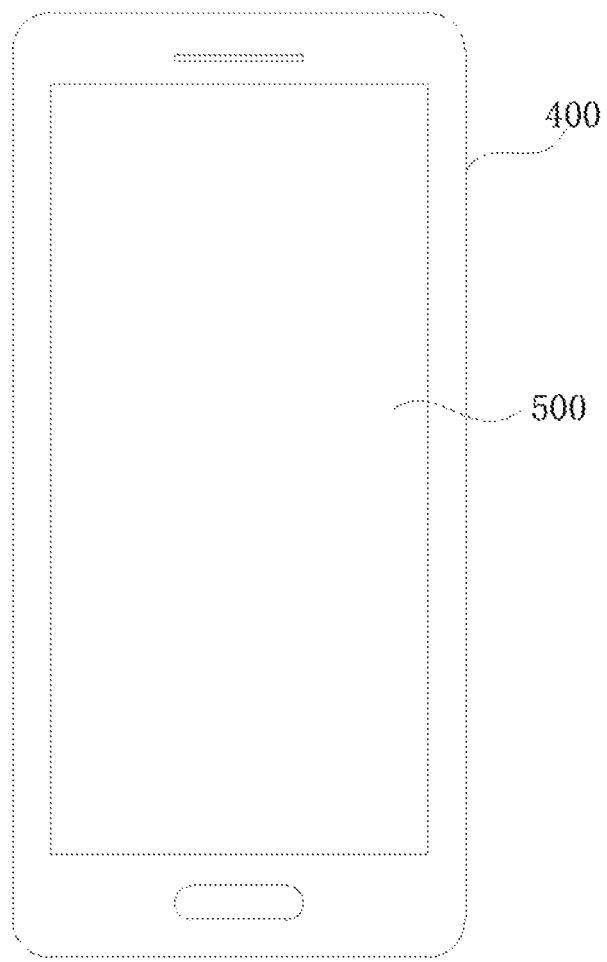
FIG. 10 illustrates an exemplary display device consistent with disclosed embodiments.

The present disclosure also provides a display device. FIG. 10 illustrates an exemplary display device consistent with disclosed embodiments. As shown in FIG. 10, the display device 400 may include a display panel 500. The display panel 500 may include an array substrate described in any above embodiment. In particular, the display device 400 may be a cellphone shown in FIG. 10, a computer, a TV station, or a smart wearable display device, etc. The present disclosure is not intended to limit the specific type of the display device.

It should be noted that, the above detailed descriptions illustrate merely preferred embodiments of the present disclosure as well as technologies and principles applied herein. Those skilled in the art can understand that the present disclosure is not limited to the specific embodiments described herein, and numerous significant alterations, modifications and alternatives may be devised by those skilled in the art without departing from the spirit and scope of the present disclosure. Thus, although the present disclosure has been illustrated in above-described embodiments in details, the present disclosure is not limited to the above embodiments. Any equivalent or modification thereof, without departing from the spirit and principle of the present invention, falls within the true scope of the present invention, and the scope of the present disclosure is defined by the appended claims.

What is claimed is:

1. An array substrate, comprising:
   a substrate; and
   a plurality of scanning lines and a plurality of data lines disposed on the substrate, the plurality of scanning lines and the plurality of data lines being insulated and intersected to define a plurality of pixel units,
   wherein a pixel unit of the plurality of pixel units includes a thin film transistor and a pixel electrode, a gate electrode of the thin film transistor is electrically connected to a scanning line of the plurality of scanning lines, a source electrode of the thin film transistor is electrically connected to a data line of the plurality of data lines, and a drain electrode of the thin film transistor is electrically connected to the pixel electrode of the pixel unit,
   the scanning line is disposed between the source electrode and the drain electrode along a longitudinal direction of the data line,
   at least one of the plurality of scanning lines is disposed between the source electrode of the thin film transistor and the drain electrode of the thin film transistor along a longitudinal direction of the scanning line, an effective length of a channel region of the thin film transistor is longer than or equal to one third of a length of the pixel unit along a longitudinal direction of the scanning line, the effective length of the channel region of the thin film transistor is longer than a distance between the source electrode and the drain electrode of the thin film transistor along the longitudinal direction of the scanning line, the channel region includes two sub-channel regions, connected to each other, extending along the longitudinal direction of the scanning line, and the scanning line includes a first border and a second border, the first border and the second border extending in parallel with each other in plan view, uninterruptedly, and longitudinally along the two sub-channel regions across the plurality of pixel units, and an orthogonal projection of the scanning line onto the substrate covers orthogonal projections of the two sub-channel regions onto the substrate.

2. The array substrate according to claim 1, wherein:
the data line electrically connected to the source electrode of the thin film transistor and the drain electrode of the thin film transistor are spaced apart by at least one of the plurality of data lines.

3. The array substrate according to claim 2, wherein:
among two data lines adjacent to the drain electrode of the thin film transistor, the data line with a shorter distance to the source electrode of the thin film transistor is a first data line, the data line with a longer distance to the source electrode of the thin film transistor is a second data line, and a distance from the drain electrode of the thin film transistor to the first data line is longer than a distance from the drain electrode of the thin film transistor to the second data line.

4. The array substrate according to claim 1, wherein:
the source electrode of the thin film transistor is electrically connected to one of the data lines adjacent to the drain electrode of the thin film transistor.

5. The array substrate according to claim 4, wherein:
a distance from the drain electrode of the thin film transistor to the data line electrically connected to the source electrode of the thin film transistor is longer than a distance from the drain electrode of the thin film transistor to another data line adjacent to the drain electrode of the thin film transistor.

6. The array substrate according to claim 1, wherein:
the effective length of the channel region of the thin film transistor is longer than a distance between the source electrode and the drain electrode of the thin film transistor along the longitudinal direction of the scanning line.

7. The array substrate according to claim 1, wherein:
a projection of the channel region of the thin film transistor on the substrate has one or more C-shaped buckling portions.

8. The array substrate according to claim 1, wherein:
the source electrode and the drain electrode of the thin film transistor are spaced apart by at least one of the plurality of scanning lines along the longitudinal direction of the data line.

9. The array substrate according to claim 1, wherein:
the thin film transistor is a low temperature poly-silicon thin film transistor.

10. The array substrate according to claim 1, wherein:
the thin film transistor is a top gate structure, and the channel region of the thin film transistor is disposed on one side of the gate electrode facing towards the substrate.

11. The array substrate according to claim 1, wherein:
the pixel unit further includes a light-shielding layer, the light-shielding layer is disposed on one side of the channel region of the thin film transistor facing towards the substrate, and a vertical projection of the light-shielding layer on the substrate covers a vertical projection of the channel region of the thin film transistor on the substrate.

12. A display panel comprising an array substrate, wherein the array substrate comprises:
a substrate; and
a plurality of scanning lines and a plurality of data lines disposed on the substrate, the plurality of scanning lines and the plurality of data lines being insulated and intersected to define a plurality of pixel units;

wherein a pixel unit of the plurality of pixel units includes a thin film transistor and a pixel electrode, a gate electrode of the thin film transistor is electrically connected to a scanning line of the plurality of scanning lines, a source electrode of the thin film transistor is electrically connected to a data line of the plurality of data lines, and a drain electrode of the thin film transistor is electrically connected to the pixel electrode of the pixel unit, the scanning line is disposed between the source electrode and the drain electrode along a longitudinal direction of the data line, at least one of the plurality of scanning lines is disposed between the source electrode of the thin film transistor and the drain electrode of the thin film transistor along a longitudinal direction of the scanning line, an effective length of a channel region of the thin film transistor is longer than or equal to one third of a length of the pixel unit along a longitudinal direction of the scanning line, the effective length of the channel region of the thin film transistor is longer than a distance between the source electrode and the drain electrode of the thin film transistor along the longitudinal direction of the scanning line, the channel region includes two sub-channel regions, connected to each other, extending along the longitudinal direction of the scanning line, and the scanning line includes a first border and a second border, the first border and the second border extending in parallel with each other in plan view, uninterruptedly, and longitudinally along the two sub-channel regions across the plurality of pixel units, and an orthogonal projection of the scanning line onto the substrate covers orthogonal projections of the two sub-channel regions onto the substrate.

13. The display panel according to claim 12, wherein:
the data line electrically connected to the source electrode of the thin film transistor and the drain electrode of the thin film transistor are spaced apart by at least one of the plurality of data lines.

14. The display panel according to claim 12, wherein:
a projection of the channel region of the thin film transistor on the substrate has a plurality of buckling portions.

15. The display panel according to claim 12, wherein:
the source electrode and the drain electrode of the thin film transistor are spaced apart by at least one of the plurality of scanning lines along the longitudinal direction of the data line.

16. The display panel according to claim 12, wherein:
the thin film transistor is a top gate structure, and the channel region of the thin film transistor is disposed on one side of the gate electrode facing towards the substrate.

17. The display panel according to claim 12, further comprising:
a color film substrate arranged opposite to the array substrate; and
a black matrix disposed on the color film substrate,
wherein a vertical projection of the thin film transistor on the color film substrate is located inside the black matrix.

18. The display panel according to claim 12, wherein:
an image refresh frequency of the display panel is within a range of approximately 0.5 Hz-45 Hz.

19. A display device, comprising:
a display panel comprising an array substrate, wherein the array substrate comprises:
a substrate; and
a plurality of scanning lines and a plurality of data lines disposed on the substrate, the plurality of scanning lines and the plurality of data lines being insulated and intersected to define a plurality of pixel units;
wherein a pixel unit of the plurality of pixel units includes a thin film transistor and a pixel electrode, a gate electrode of the thin film transistor is electrically connected to a scanning line of the plurality of scanning lines, a source electrode of the thin film transistor is electrically connected to a data line of the plurality of data lines, and a drain electrode of the thin film transistor is electrically connected to the pixel electrode of the pixel unit,
the scanning line is disposed between the source electrode and the drain electrode along a longitudinal direction of the data line,
at least one of the plurality of scanning lines is disposed between the source electrode of the thin film transistor and the drain electrode of the thin film transistor along a longitudinal direction of the scanning line,
an effective length of a channel region of the thin film transistor is longer than or equal to one third of a length of the pixel unit along a longitudinal direction of the scanning line,
the effective length of the channel region of the thin film transistor is longer than a distance between the source electrode and the drain electrode of the thin film transistor along the longitudinal direction of the scanning line,
the channel region includes two sub-channel regions, connected to each other, extending along the longitudinal direction of the scanning line, and
the scanning line includes a first border and a second border, the first border and the second border extending in parallel with each other in plan view, uninterruptedly, and longitudinally along the two sub-channel regions across the plurality of pixel units, and an orthogonal projection of the scanning line onto the substrate covers orthogonal projections of the two sub-channel regions onto the substrate.

* * * * *